United States Patent
Yasuda et al.

(10) Patent No.: US 9,735,762 B2
(45) Date of Patent: Aug. 15, 2017

(54) AMPLIFIER

(71) Applicant: Kabushiki Kaisha Toshiba, Minato-ku, Tokyo (JP)

(72) Inventors: Katsuhiro Yasuda, Yokohama Kanagawa (JP); Hiroyuki Tsurumi, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/068,071

(22) Filed: Mar. 11, 2016

(65) Prior Publication Data

US 2017/0149421 A1    May 25, 2017

Related U.S. Application Data

(60) Provisional application No. 62/258,232, filed on Nov. 20, 2015.

(51) Int. Cl.
*H03K 5/08* (2006.01)
*H03K 5/003* (2006.01)

(52) U.S. Cl.
CPC ............. *H03K 5/08* (2013.01); *H03K 5/003* (2013.01)

(58) Field of Classification Search
CPC .......... H03K 5/08; H03K 5/003; H03K 21/02
USPC ................. 327/309, 312, 315, 321, 560, 561
See application file for complete search history.

(56) References Cited

U.S. PATENT DOCUMENTS

| | | | | | |
|---|---|---|---|---|---|
| 4,590,394 | A | * | 5/1986 | Pace | H03G 11/06 327/309 |
| 4,727,332 | A | * | 2/1988 | Bundy | H03K 5/08 327/309 |
| 5,856,760 | A | * | 1/1999 | Lam | H03F 1/52 327/312 |
| 8,611,561 | B2 | * | 12/2013 | Sakai | H03F 1/52 330/307 |
| 2005/0206429 | A1 | | 9/2005 | Misawa et al. | |

FOREIGN PATENT DOCUMENTS

JP       2953432 B2     9/1999
JP       2009-273042 A  11/2009

* cited by examiner

*Primary Examiner* — Dinh T Le
(74) *Attorney, Agent, or Firm* — White & Case LLP

(57) ABSTRACT

An amplifier includes a first voltage generating circuit that generates a first clamp voltage based on a reference voltage and a first voltage, a second voltage generating circuit that generates a second clamp voltage based on the reference voltage and a second voltage that is lower than the first voltage, a third voltage generating circuit that generates a second AC voltage that changes with the same voltage amplitude in a vertical direction of the reference voltage, based on an input first AC voltage, within a voltage range of the first voltage and the first clamp voltage, or within a voltage range of the second clamp voltage and the second voltage, and an amplification circuit that amplifies the voltage amplitude of the second AC voltage and generates a third AC voltage.

17 Claims, 3 Drawing Sheets

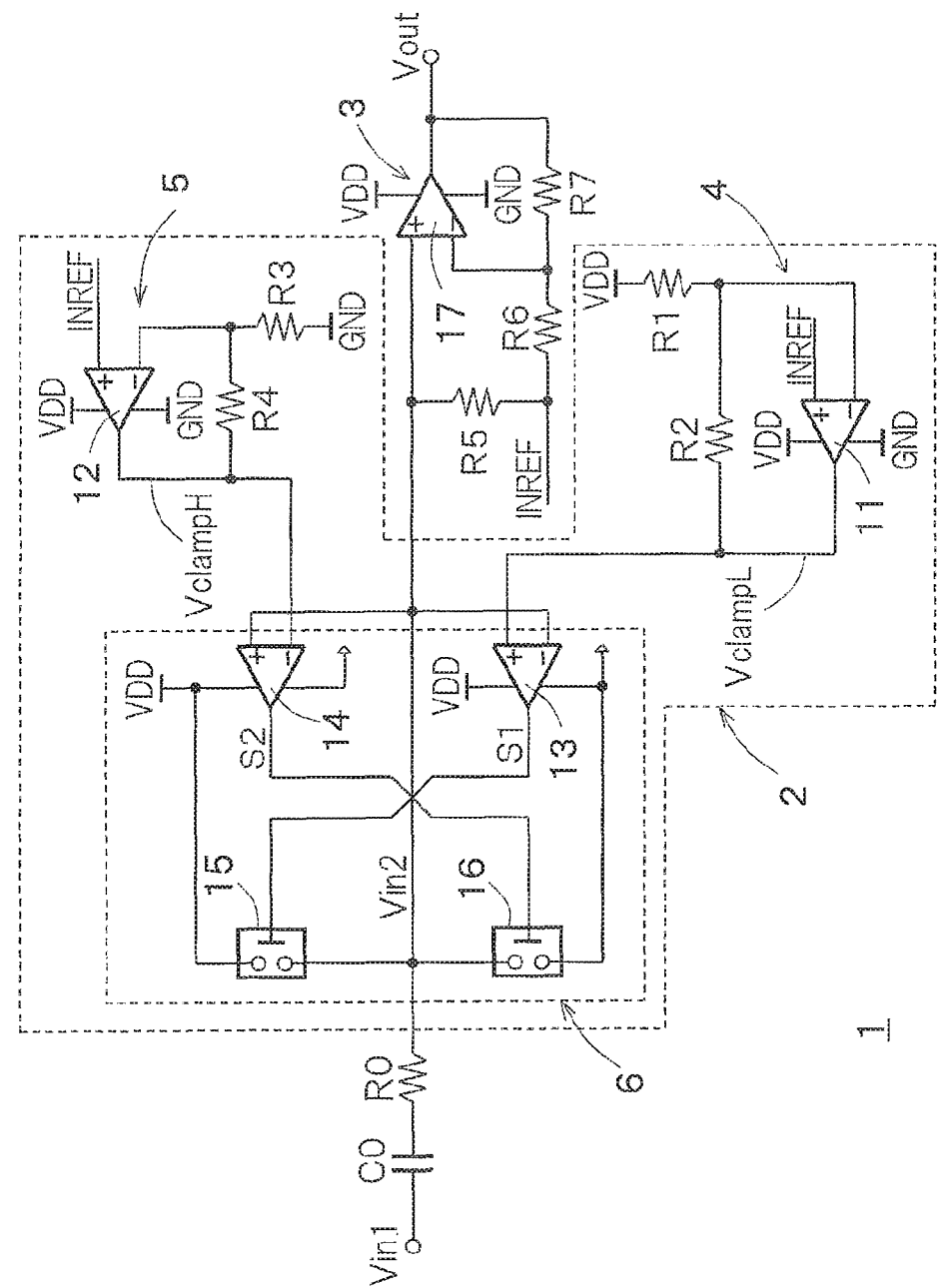
F I G. 1

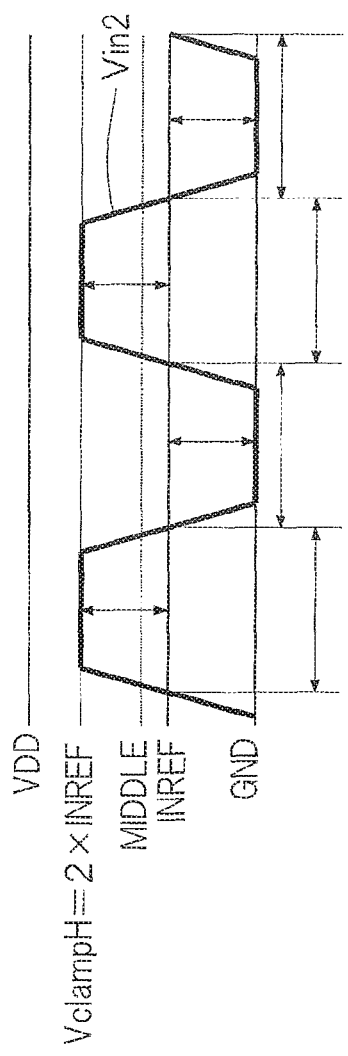
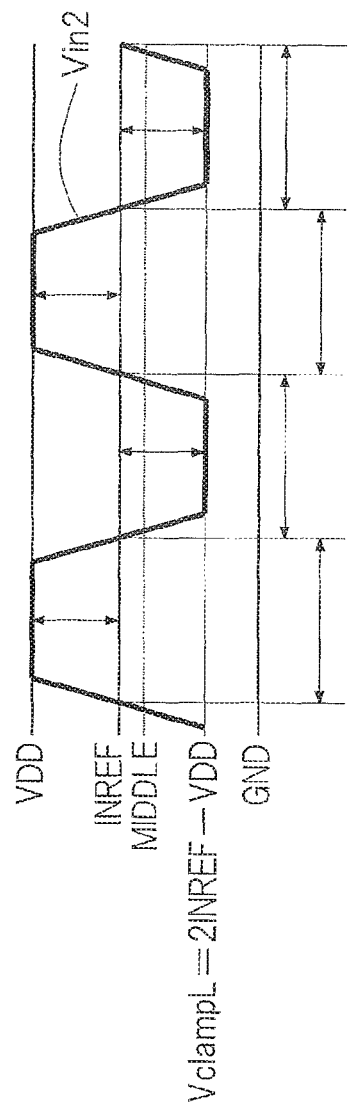
FIG. 2A
FIG. 2B

AMPLIFIER

CROSS REFERENCE TO RELATED APPLICATIONS

This application is based upon and claims the benefit of priority from the prior U.S. Provisional Patent Application No. 62/258,232 filed on Nov. 20, 2015, the entire contents of which are incorporated herein by reference.

FIELD

The present invention relates to an amplifier.

BACKGROUND

An amplifier generally amplifies an input signal using an operational amplifier. An amplifier is unable to generate a voltage at a level equal to or higher than a supply-power voltage thereof. Therefore, voltage amplitude of an input voltage may be limited by installing a clamp circuit inside the amplifier. The clamp circuit limits the voltage amplitude based on a reference voltage INREF. Therefore, when a voltage level of the reference voltage INREF fluctuates, a voltage output from the clamp circuit (hereinafter called a "clamp voltage") may not become symmetric in higher and lower sides than the reference voltage INREF.

In a case where the clamp voltage is not symmetric with respect to the reference voltage INREF, a difference is caused in charge and discharge current of a DC cut capacitance between a case where the input voltage is higher than the reference voltage INREF and a case where the input voltage is lower than the reference voltage INREF. As a result, a DC offset of an operational amplifier is caused.

BRIEF DESCRIPTION OF THE DRAWINGS

FIG. 1 is a circuit diagram illustrating an internal configuration of an amplifier according to an embodiment of the present invention;

FIGS. 2A and 2B are voltage waveform charts of a second AC voltage;

DETAILED DESCRIPTION

Figure 3:
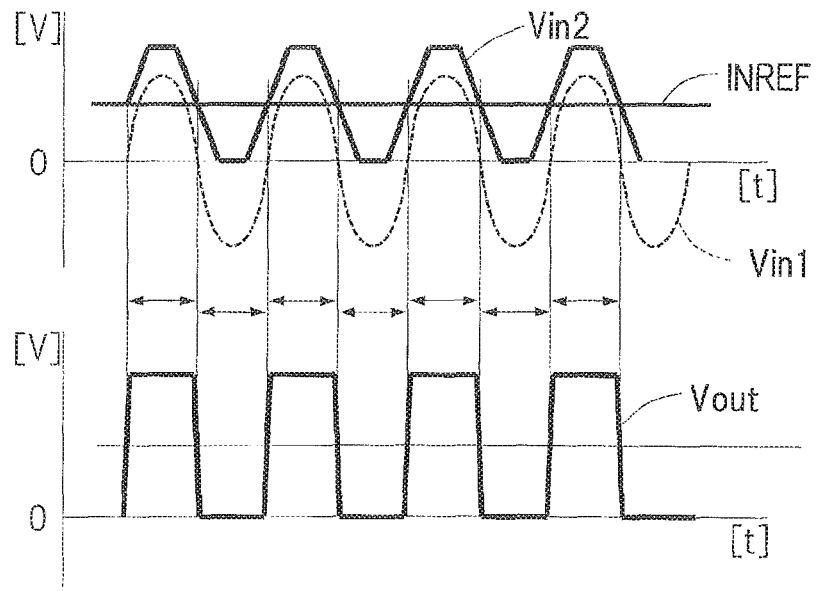
FIG. 3 is a voltage waveform chart of a third AC voltage output from an amplification circuit.

According to one embodiment, an amplifier has a first voltage generating circuit that generates a first damp voltage based on a reference voltage and a first voltage, a second voltage generating circuit that generates a second clamp voltage based on the reference voltage and a second voltage that is lower than the first voltage, a third voltage generating circuit that generates a second AC voltage that changes with an identical voltage amplitude in higher and lower sides than the reference voltage, based on an input first AC voltage, within a voltage range of the first voltage and the first clamp voltage, or within a voltage range of the second clamp voltage and the second voltage, and an amplification circuit that amplifies voltage amplitude of the second AC voltage to generate a third AC voltage.

An embodiment of the present invention will be described below with reference to the drawings. FIG. 1 is a circuit diagram illustrating an internal configuration of an amplifier 1 according to an embodiment. The amplifier 1 of FIG. 1 amplifies and outputs an AC voltage signal such as a voice signal (hereinafter called a "first AC voltage Vin1"). The first AC voltage Vin1 that is input into the amplifier 1 of FIG. 1 is not necessarily limited to the voice signal, and an arbitrary AC signal can be input. The amplifier 1 of FIG. 1 can be built in a semiconductor IC, but a plurality of discrete components may be mounted on a printed board or the like.

The first AC voltage Vin1 is input into the amplifier 1 of FIG. 1. A capacitor C0 and a resistor R0 are connected in series to an input path of the first AC voltage Vin1. The capacitor C0 eliminates a DC component included in the first AC voltage Vin1. The resistor R0 has a function of passing a charge and discharge current of the capacitor C0. In a case where the amplifier 1 is built in the semiconductor IC, at least one of the capacitor C0 and the resistor R0 may be externally connected to the semiconductor IC. Alternatively, both the capacitor C0 and the resistor R0 may be built in the semiconductor IC.

The amplifier 1 of FIG. 1 includes an input voltage conversion circuit 2 and an amplification circuit 3. Regardless of a voltage level of a reference voltage INREF, the input voltage conversion circuit 2 generates, from the input first AC voltage Vin1, a second AC voltage Vin2 that changes with the same voltage amplitude in higher and lower sides than the reference voltage INREF. Here, the reference voltage INREF is generated by, for example, an unillustrated reference voltage generating circuit inside the semiconductor IC which has the amplifier 1 built-in. This reference voltage generating circuit includes, for example, an unillustrated MOS transistor, and the voltage level of the reference voltage INREF may fluctuate in accordance with environmental conditions such as a variation in element and temperature. The amplifier 1 according to the present embodiment can, as described later, stably carry out an amplifying operation without being affected by a fluctuation of the voltage level of the reference voltage INREF even when such a fluctuation occurs.

The amplification circuit 3 amplifies the voltage amplitude of the second AC voltage Vin2 and generates a third AC voltage Vout which has the same duty ratio as the first AC voltage Virile That is, the amplification circuit 3 generates, regardless of the voltage level of the reference voltage INREF, the third AC voltage Vout with the same duty ratio as the first AC voltage Vin1.

The input voltage conversion circuit 2 includes a first voltage generating circuit 4, a second voltage generating circuit 5, and a third voltage generating circuit 6.

The first voltage generating circuit 4 generates, based on the reference voltage INREF and a first voltage VDD, a first damp voltage VclampL that is a lower limit. The first voltage generating circuit 4 includes a first differential amplifier 11 that generates the first clamp voltage VclampL according to a voltage difference between, for example, the first voltage VDD and the reference voltage INREF.

The reference voltage INREF is input into a non-inverting input terminal of the first differential amplifier 11, and the first voltage VDD is input into an inverting input terminal thereof through a resistor R1. A resistor R2 is interposed between an output terminal and the inverting input terminal of the first differential amplifier 11. A resistance ratio between the resistors R1 and R2 is, for example, 1:1. In this case, the first clamp voltage VclampL that is output from the first differential amplifier 11 is VDD−2×(VDD−INREF)=2× INREF−VDD. A specific resistance ratio between the resistors R1 and R2 and specific resistance values thereof may be arbitrarily changed. The second voltage generating circuit 5 generates, based on the reference voltage INREF and a second voltage GND that is lower than the first voltage VDD, a second clamp voltage VclampH that is an upper limit. The second voltage generating circuit 5 includes a second differential amplifier 12 that generates the second clamp voltage VclampH according to a voltage difference between, for example, the reference voltage INREF and the second voltage GND that is lower than the first voltage VDD.

The reference voltage INREF is input into a non-inverting input terminal of the second differential amplifier 12, and the second voltage GND is input into an inverting input terminal thereof through a resistor R3. A resistor R4 is interposed between an output terminal and the inverting input terminal of the second differential amplifier 12. A resistance ratio between the resistors R3 and R4 is, for example, 1:1. In this case, the second clamp voltage VclampH that is output from the second differential amplifier 12 is 2×INREF. A specific resistance ratio between the resistors R3 and R4 and specific resistance values thereof may be arbitrarily changed.

Here, the first voltage VDD and the second voltage GND are voltages used as a supply-power voltage by the first differential amplifier 11 and the second differential amplifier 12. For example, the first voltage VDD is 12 V, and the second voltage GND is 0 V.

The third voltage generating circuit 6 generates, based on the input first AC voltage Vin1, the second AC voltage Vin2 that has been oscillated with the same voltage amplitude in higher and lower sides than the reference voltage INREF within the voltage range of the first voltage VDD and the first clamp voltage VclampL, or within the voltage range of the second clamp voltage VclampH and the second voltage GND.

The third voltage generating circuit 6 includes a third differential amplifier 13, a fourth differential amplifier 14, a first clamp circuit 15, and a second clamp circuit 16.

The third differential amplifier 13 generates a first signal S1 according to a voltage difference between the second AC voltage Vin2 and the first clamp voltage VclampL. The first signal S1 is used for determining whether or not the first clamp circuit 15 clamps the second AC voltage Vin2. Here, a term "clamp" means forcibly setting the second AC voltage Vin2 at a predetermined voltage.

The second AC voltage Vin2 is input into an inverting input terminal of the third differential amplifier 13, and the first clamp voltage VclampL is input into a non-inverting input terminal thereof. The third differential amplifier 13 generates the first signal 51 that indicates whether or not the second AC voltage Vin2 has decreased to a level equal to the first clamp voltage VclampL.

The fourth differential amplifier 14 generates a second signal 52 according to a voltage difference between the second AC voltage Vin2 and the second clamp voltage VclampH. The second signal S2 is used for determining whether or not the second clamp circuit 16 clamps the second AC voltage Vin2.

The second clamp voltage VclampH is input into an inverting input terminal of the fourth differential amplifier 14, and the second AC voltage Vin2 is input into a non-inverting input terminal thereof. The fourth differential amplifier 14 generates the second signal S2 that indicates whether or not the second AC voltage Vin2 has increased to a level equal to the second clamp voltage VclampH.

The third differential amplifier 13 and the fourth differential amplifier 14 generate the first signal S1 and the second signal S2 by using the first voltage VDD as a power-supply voltage.

The first clamp circuit 15 clamps the second AC voltage Vin2 to the first clamp voltage VclampL, when it is detected by the first signal S1 that the second AC voltage Vin2 has decreased to the level equal to the first clamp voltage VclampL. The first clamp voltage VclampL is a lower limit voltage that should be set for the second AC voltage Vin2. Therefore, the first clamp circuit 15 determines, by the first signal S1, timing for setting the second AC voltage Vin2 at the first clamp voltage VclampL which is the lower limit voltage.

The second clamp circuit 16 clamps the second AC voltage Vin2 to the second clamp voltage VclampH, when it is detected by the second signal S2 that the second AC voltage Vin2 has increased to the level equal to the second clamp voltage VclampH. The second damp voltage VclampH is an upper limit voltage that should be set for the second AC voltage Vin2. Therefore, the second clamp circuit 16 determines, by the second signal S2, timing for setting the second AC voltage Vin2 at the second clamp voltage VclampH which is the upper limit voltage.

A resistor R5 is interposed between a voltage path of the second AC voltage Vin2 and a voltage path of the reference voltage INREF. By installing the resistor R5, in a case where voltage amplitude of the first AC voltage Vin1 is zero, the second AC voltage Vin2 and the reference voltage INREF become equipotential, and a DC level of the second AC voltage Vin2 can be equalized to the reference voltage INREF.

The amplification circuit 3 includes a fifth differential amplifier 17 that amplifies the voltage amplitude of the second AC voltage Vin2 and generates the third AC voltage Vout. The second AC voltage Vin2 is input into a non-inverting input terminal of the fifth differential amplifier 17, and the reference voltage INREF is input into an inverting input terminal thereof through a resistor R6. A resistor R7 is interposed between the inverting input terminal and an output terminal of the fifth differential amplifier 17.

A resistance ratio between the resistors R6 and R7 is not particularly considered, but is, for example, 1:1. In a case where the resistance ratio between the resistors R6 and R7 is 1:1, the fifth differential amplifier 17 amplifies an AC component of the second AC voltage Vin2. by an amplification factor of two and outputs the third AC voltage Vout.

FIGS. 2A and 2B are voltage waveform charts of the second AC voltage Vin2. More specifically, FIG. 2A is a voltage waveform chart of the second AC voltage Vin2 in a case where the reference voltage INREF is lower than a middle voltage between the first voltage VDD and the second voltage GND. FIG. 2B is a voltage waveform chart of the second AC voltage Vin2 in a case where the reference voltage INREF is higher than the middle voltage.

In a case where the reference voltage INREF is lower than the middle voltage, the voltage amplitude of the second AC voltage Vin2 in higher than the reference voltage INREF may become larger than the voltage amplitude on a lower side thereof. Thus, at the fourth differential amplifier 14 in the third voltage generating circuit 6, when it is detected that the second AC voltage Vin2 has increased to the level equal to the second clamp voltage VclampH, the second AC voltage Vin2 is clamped to the second clamp voltage VclampH in the second clamp circuit 16. Consequently, as illustrated in FIG. 2A, the second AC voltage Vin2 forms a voltage waveform where the maximum voltage level thereof is clamped to the second damp voltage VclampH. The second clamp voltage VclampH is 2×reference voltage INREF. The minimum voltage level of the second AC voltage Vin2 in this case is the second voltage GND.

On the other hand, in a case where the reference voltage INREF is higher than the middle voltage, the voltage amplitude of the second AC voltage Vin2 in the lower side of the reference voltage INREF may become larger than the voltage amplitude in the higher side thereof. Thus, at the third differential amplifier 13 in the third voltage generating circuit 6, when it is detected that the second AC voltage Vin2 has decreased to the level equal to the first clamp voltage VclampL, the second AC voltage Vin2 is clamped to the first clamp voltage VclampL in the first clamp circuit 15. Consequently, as illustrated in FIG. 2B, the second AC voltage Vin2 forms a voltage waveform where the minimum voltage level thereof is clamped to the first clamp voltage VclampL. The first clamp voltage VclampL is VDD−2×(VDD−INREF)=2×INREF−VDD. The maximum voltage level of the second AC voltage Vin2 in this case is the first voltage VDD.

Thus, with the amplifier 1 of FIG. 1, even if the reference voltage INREF is higher or lower than the middle voltage between the first voltage VDD and the second voltage GND, it is possible to generate the second AC voltage Vin2 that changes with the same voltage amplitude in higher and lower sides than the reference voltage INREF.

Meanwhile, in a case where the reference voltage INREF is the middle voltage between the first voltage VDD and the second voltage GND, a maximum value of the second AC voltage Vin2 is the first voltage VDD, and a minimum value thereof is the second voltage GND.

FIG. 3 is a voltage waveform chart of the third AC voltage Vout that is output from the amplification circuit 3. FIG. 3 illustrates voltage waveforms of the first AC voltage Vin1, the second AC voltage Vin2, the reference voltage INREF, and the third AC voltage Vout.

The amplification circuit 3 generates the third AC voltage Vout obtained by amplifying a voltage difference between the second AC voltage Vin2 and the reference voltage INREF. However, the second AC voltage Vin2 is the voltage that changes with the same voltage amplitude in higher and lower sides than the reference voltage INREF, and the third AC voltage Vout obtained by subtracting the reference voltage INREF from this voltage is also an AC voltage with the same duty ratio as the second AC voltage Vin2.

Figure 4:
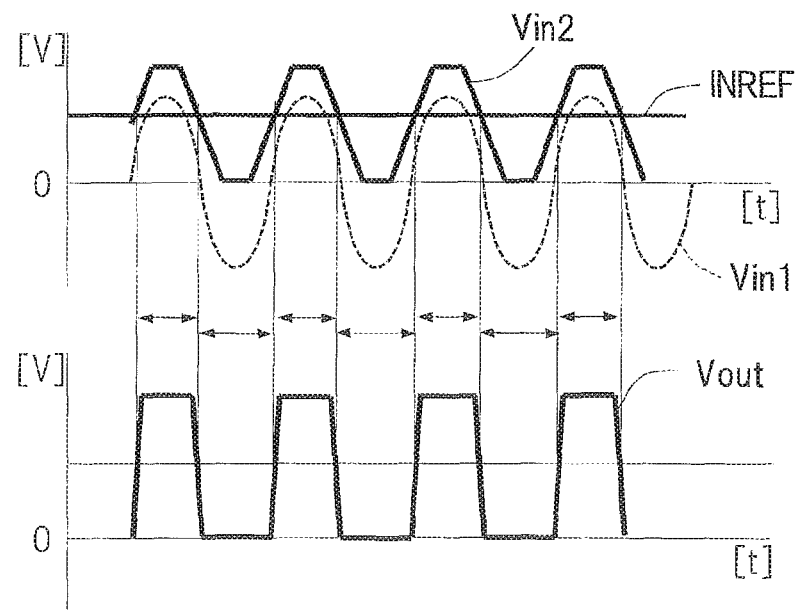
FIG. 4 is a voltage waveform chart of an amplifier according to a comparative example where first and second voltage generating circuits are omitted from FIG. 1.

FIG. 4 is a voltage waveform chart of an amplifier 1 according to a comparative example where the first voltage generating circuit 4 and the second voltage generating circuit 5 are omitted from FIG. 1. In FIG. 4, it is assumed that a first clamp voltage of a third differential amplifier 13 in a third voltage generating circuit 6 is a second voltage GND and that a second clamp voltage of a fourth differential amplifier 14 is a first voltage VDD. In a case of FIG. 4, voltage amplitudes of a second AC voltage Vin2 in higher and lower sides than a reference voltage INREF are different from each other. Therefore, a third AC voltage Vout of FIG. 4 has a duty ratio different from a first AC voltage Vin1. The duty ratio of the third AC voltage Vout of FIG. 4 changes depending on how far the reference voltage INREF deviates from a middle voltage between the first voltage VDD and the second voltage GND and a direction deviating from the middle voltage.

In contrast, in a case of the present embodiment, even when the reference voltage INREF deviates from the middle voltage, the second AC voltage Vin2 changes with the same voltage amplitude in higher and lower sides than the reference voltage INREF. Therefore, the duty ratio of the third AC voltage Vout is nearly the same as that of the first AC voltage Vin1.

Thus, in the present embodiment, regardless of the voltage level of the reference voltage INREF, the second AC voltage Vin2 that changes with the same voltage amplitude in higher and lower sides than the reference voltage INREF is generated from the input first AC voltage Vin1 and input into the amplification circuit 3. Therefore, the third AC voltage Vout with the same duty ratio as the first AC voltage Vin1 can be output from the amplification circuit 3. Consequently, according to the present embodiment, even when the voltage level of the reference voltage INREF fluctuates, the third AC voltage Vout that has been amplified by a desired amplification factor can be generated while maintaining an original duty ratio of the first AC voltage Vin1, and reliability as the amplifier 1 is improved.

In addition, according to the present embodiment, even when the reference voltage INREF fluctuates, the second AC voltage Vin1 changes with the same voltage amplitude in higher and lower sides than the reference voltage INREF. Therefore, currents flowing through the resistor R0 during charging and discharging of the capacitor C0 become equal, and a DC offset of the fifth differential amplifier 17 in the amplification circuit 3 can be reduced.

Some embodiments according to the present invention have been described, but these embodiments have been presented as examples and are not intended to limit the scope of the invention. These new embodiments can be implemented in other various forms, and various types of omissions, substitutions, or changes can be made without departing from the spirit of the invention. These embodiments and their modifications fall within the scope and spirit of the invention, and are included in the invention provided in the claims and the scope of equivalents thereof.

The invention claimed is:

1. An amplifier comprising:
   a first voltage generating circuit that generates a first clamp voltage based on a reference voltage and a first voltage;
   a second voltage generating circuit that generates a second clamp voltage based on the reference voltage and a second voltage that is lower than the first voltage;
   a third voltage generating circuit that generates a second AC voltage that changes with an identical voltage amplitude in higher and lower sides than the reference voltage, based on an input first AC voltage, within a voltage range of the first voltage and the first clamp voltage, or within a voltage range of the second clamp voltage and the second voltage; and
   an amplification circuit that amplifies voltage amplitude of the second AC voltage to generate a third AC voltage.

2. The amplifier according to claim 1, wherein the first voltage generating circuit comprises a first differential amplifier that generates the first clamp voltage in accordance with a voltage difference between the first voltage and the reference voltage, and
   the second voltage generating circuit comprises a second differential amplifier that generates the second clamp voltage in accordance with a voltage difference between the reference voltage and the second voltage.

3. The amplifier according to claim 2, wherein the first differential amplifier generates the first clamp voltage using the first and second voltages as a power-supply voltage, and
   the second differential amplifier generates the second clamp voltage using the first and second voltages as a power-supply voltage.

4. The amplifier according to claim 2, wherein the first clamp voltage and the second clamp voltage are voltages between the first voltage and the second voltage.

5. The amplifier according to claim 1 wherein the third voltage generating circuit comprises:
   a third differential amplifier that generates a first signal in accordance with a voltage difference between the second AC voltage and the first clamp voltage;
   a fourth differential amplifier that generates a second signal in accordance with a voltage difference between the second AC voltage and the second clamp voltage;
   a first clamp circuit that clamps the second AC voltage to the first clamp voltage when it is detected by the first signal that the second AC voltage has decreased to a level equal to the first clamp voltage; and
   a second clamp circuit that clamps the second AC voltage to the second clamp voltage when it is detected by the second signal that the second AC voltage has increased to a level equal to the second clamp voltage.

6. The amplifier according to claim 5, comprising a resistor that is interposed between a voltage path of the second AC voltage and a voltage path of the reference voltage.

7. The amplifier according to claim 1, wherein the amplification circuit generates, regardless of a voltage level of the reference voltage, the third AC voltage with a duty ratio equal to a duty ratio of the first AC voltage.

8. The amplifier according to claim 1, wherein the amplification circuit comprises a fifth differential amplifier that generates the third AC voltage in accordance with a voltage difference between the second AC voltage and the reference voltage.

9. An amplifier comprising:
   an input voltage conversion circuit that generates from an input first AC voltage, a second AC voltage that changes with an identical voltage amplitude in higher and lower sides than a reference voltage; and
   an amplification circuit that amplifies voltage amplitude of the second AC voltage to generate a third AC voltage with the same duty ratio as the first AC voltage,
   wherein the input voltage conversion circuit comprises:
      a first voltage generating circuit that generates a first clamp voltage based on the reference voltage and a first voltage;
      a second voltage generating circuit that generates a second clamp voltage based on the reference voltage and a second voltage that is lower than the first voltage; and
      a third voltage generating circuit that generates the second AC voltage that changes with an identical voltage amplitude in higher and lower sides than the reference voltage, based on the first AC voltage, within a voltage range of the first voltage and the first clamp voltage, or within a voltage range of the second clamp voltage and the second voltage.

10. The amplifier according to claim 9, wherein the first voltage generating circuit comprises a first differential amplifier that generates the first clamp voltage in accordance with a voltage difference between the first voltage and the reference voltage, and
   the second voltage generating circuit comprises a second differential amplifier that generates the second clamp voltage in accordance with a voltage difference between the reference voltage and the second voltage.

11. The amplifier according to claim 10, wherein the first differential amplifier generates the first clamp voltage using the first and second voltages as a power-supply voltage, and
   the second differential amplifier generates the second clamp voltage using the first and second voltages as a power-supply voltage.

12. The amplifier according to claim 10, wherein the first clamp voltage and the second clamp voltage are voltages between the first voltage and the second voltage.

13. The amplifier according to claim 9, wherein the third voltage generating circuit comprises:
   a third differential amplifier that generates a first signal in accordance with a voltage difference between the second AC voltage and the first clamp voltage;
   a fourth differential amplifier that generates a second signal in accordance with a voltage difference between the second AC voltage and the second clamp voltage;
   a first clamp circuit that clamps the second AC voltage to the first clamp voltage when it is detected by the first signal that the second AC voltage has decreased to a level equal to the first clamp voltage; and
   a second clamp circuit that clamps the second AC voltage to the second clamp voltage when it is detected by the second signal that the second AC voltage has increased to a level equal to the second clamp voltage.

14. The amplifier according to claim 13, comprising a resistor that is interposed between a voltage path of the second AC voltage and a voltage path of the reference voltage.

15. The amplifier according to claim 9, wherein the amplification circuit generates, regardless of a voltage level of the reference voltage, the third AC voltage with the duty ratio equal to a duty ratio of the first AC voltage.

16. The amplifier according to claim 9, wherein the amplification circuit includes a fifth differential amplifier that generates the third AC voltage in accordance with a voltage difference between the second AC voltage and the reference voltage.

17. The amplifier according to claim 9, wherein the second AC voltage is generated regardless of a voltage level of the reference voltage.

* * * * *